United States Patent [19]
Dixon et al.

[11] Patent Number: 5,403,782
[45] Date of Patent: Apr. 4, 1995

[54] SURFACE MOUNTABLE INTEGRATED CIRCUIT PACKAGE WITH INTEGRATED BATTERY MOUNT

[75] Inventors: D. Craig Dixon, Lewisville; Michael J. Hundt, Double Oak, both of Tex.

[73] Assignee: SGS-Thomson Microelectronics, Inc., Carrollton

[21] Appl. No.: 995,665

[22] Filed: Dec. 21, 1992

[51] Int. Cl.$^6$ ............................................. H01L 21/60
[52] U.S. Cl. ..................... 437/209; 437/214; 437/220
[58] Field of Search ...................... 437/209, 214, 220; 365/228, 229; 429/123; 439/68, 69, 70, 71, 72, 73; 257/678, 679

[56] References Cited

U.S. PATENT DOCUMENTS

| | | | |
|---|---|---|---|
| 4,645,943 | 2/1987 | Smith, Jr. et al. | 429/123 |
| 4,864,373 | 7/1989 | Miyashita | 257/678 |
| 4,998,888 | 3/1991 | Link et al. | 439/73 |
| 5,008,776 | 4/1991 | Queyssac | 257/678 |
| 5,196,374 | 3/1993 | Hundt et al. | 437/214 |

*Primary Examiner*—Brian E. Hearn
*Assistant Examiner*—Kevin M. Picardat
*Attorney, Agent, or Firm*—Rodney M. Anderson; Lisa K. Jorgenson; Richard K. Robinson

[57] ABSTRACT

An integrated circuit package of the surface-mountable type within which a battery is mounted is disclosed. Battery leads extend from the side of the package body opposite that which is adjacent the circuit board when mounted, and between which a conventional battery may be placed. Standoffs are located on the package body for supporting the battery above the package body, so that a gap is present therebetween. A housing is attached to the package over the battery, and has standoffs attached to its inner surface so that a gap is also present between the housing and the battery. The gaps may be air gaps or filled with a low thermal conductivity material. The gaps thermally insulate the battery from the package body and housing, so that the circuit may be subjected to solder reflow mounting to a circuit board, while insulating the high temperatures from the battery.

12 Claims, 2 Drawing Sheets

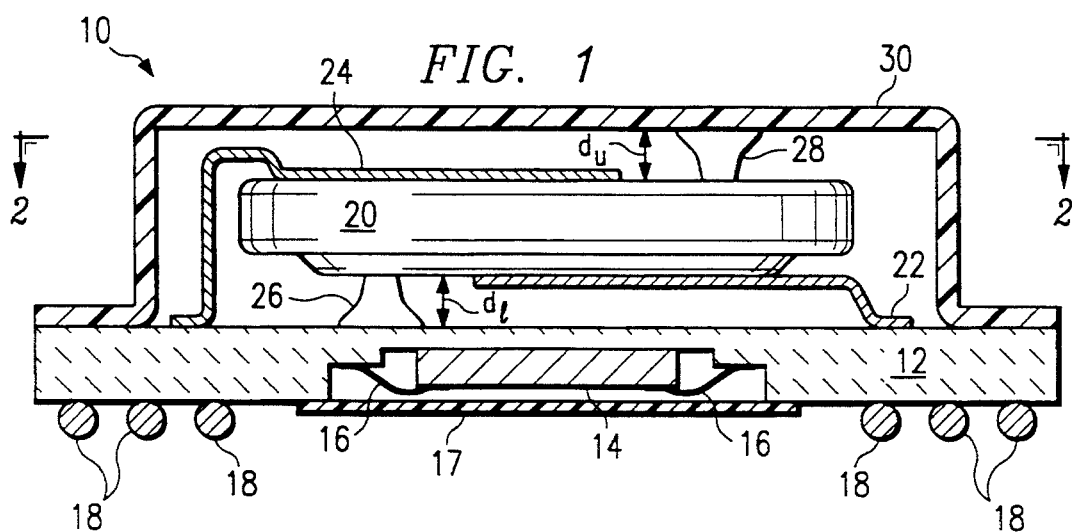
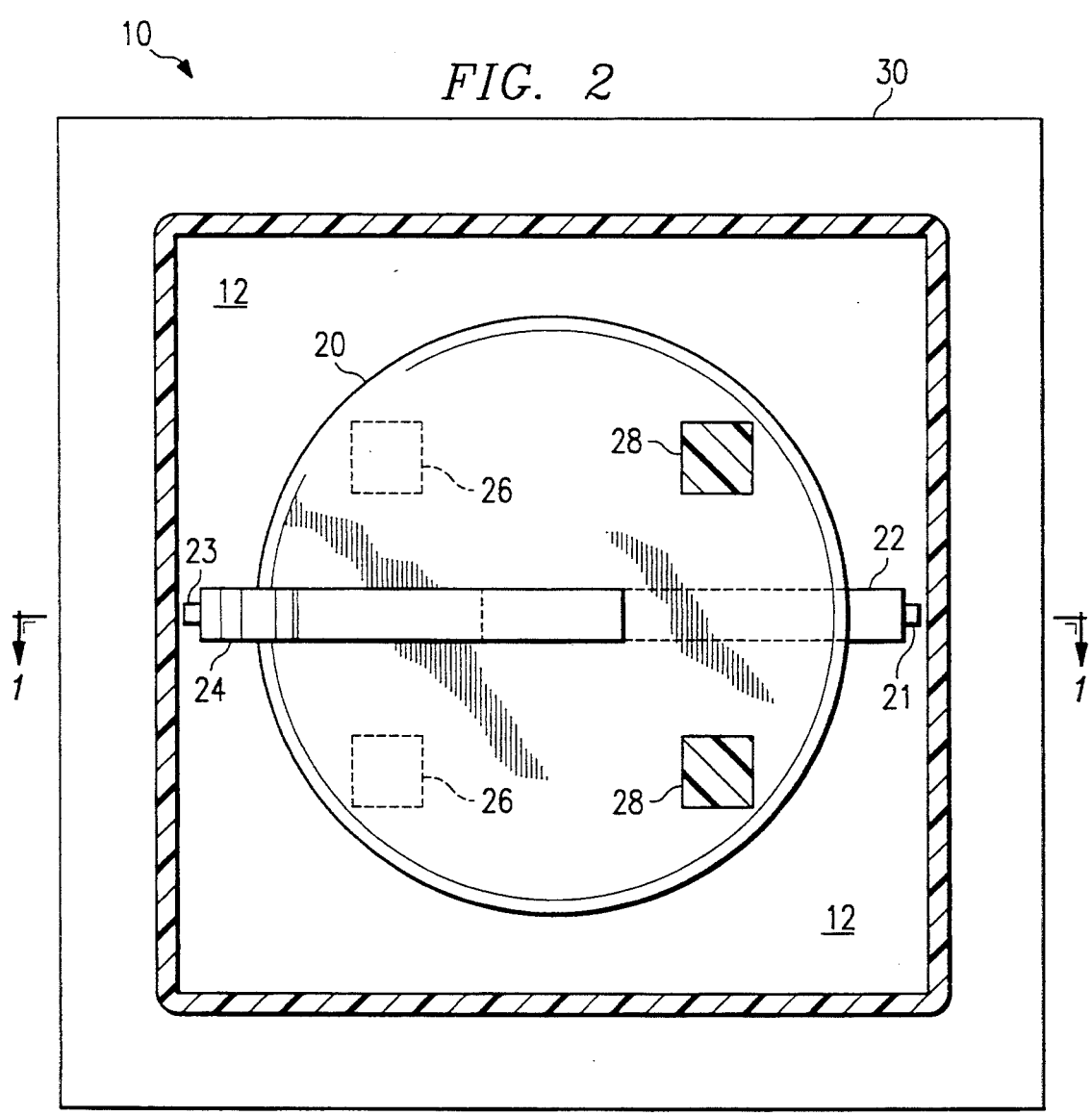

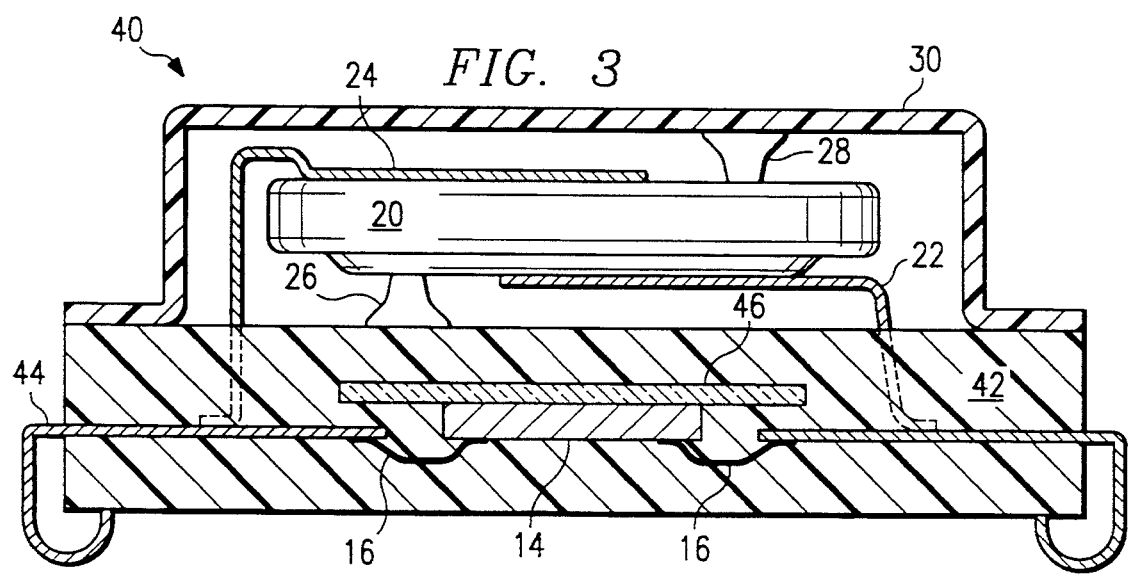

SURFACE MOUNTABLE INTEGRATED CIRCUIT PACKAGE WITH INTEGRATED BATTERY MOUNT

BACKGROUND OF THE INVENTION

This invention is in the field of integrated circuits, and more specifically is directed to the packaging of integrated circuits.

Portability has become commonplace in the field of electronic systems. For example, laptop or notebook-size computers are now commonly used, as are portable communications systems such as cellular telephones and cellular facsimile machines. As is evident to those in the art, portability of an electronic system is maximized when the circuit boards are as small and as densely populated with circuits as possible. Portability also generally requires the installation of batteries on the circuit boards, for use as primary or backup power sources.

The use of battery backup power sources has also become common in non-portable electronic systems. For example, many personal computers and workstations include battery-powered memory for purposes of maintaining an integral clock or calendar function. Such non-portable electronic systems also benefit from small form factor and densely populated circuit boards.

Modern electronic assembly technology utilizes surface mountable integrated circuit packages for high density populating of circuit boards. The leads of surface mountable packages are of such shape and size that they may be soldered to the surface of a circuit board by way of a solder reflow process, in contrast to the leads of dual-in-line packages ("DIP") which extend through holes in the circuit board for solder-connection on the reverse side. Surface mounting increases the population density of the circuit board because only traces on the surface of the board (rather than throughout the board) need be dedicated for connection to the integrated circuit. In addition, the size of the package may be reduced greatly from that required for a DIP package for the same circuit, especially where the number of leads extending from the circuit is large. Surface mount technology thus allows the form factor of the circuit board to be greatly reduced from that achievable for the same electronic function utilizing DIP circuit packages.

Conventional surface mountable integrated circuit packages exist in various forms. Ceramic hermetically sealed surface mountable packages generally are of the leadless chip-carrier type, or alternatively have solder bump or solder ball leads. Plastic encapsulated or molded surface mountable packages may be of the leaded chip carrier type, with J-leads or with flat leads extending from the body of the package.

Conventional surface mounting technology attaches the integrated circuit packages to the circuit board by way of a solder reflow process where the solder flows adjacent to the circuit package itself, rather than on the other side of the circuit board from the circuit package. As such, the temperature to which the surface mountable circuit package is exposed in solder reflow is significantly greater than that to which a DIP package is exposed in its mounting to a circuit board. While brief exposure to such a high temperature (from 180° C. to as high as 230° C.) is not believed to significantly degrade circuit reliability, such high temperature exposure has been observed to seriously degrade batteries, such as conventional lithium or silver-zinc type cells.

Because of this temperature degradation of conventional batteries, it has been heretofore impractical, if not impossible, to reliably integrate a battery into a surface mountable integrated circuit package. As such, according to conventional packaging technology, batteries must be inserted into battery-powered circuits in surface mount applications after solder reflow mounting of the integrated circuit package to the circuit board, complicating and increasing the cost of manufacture of the electronic system.

By way of further background, DIP packages have been produced which include a battery integrated therewithin, due to the reduced temperatures to which the DIP circuit package is exposed during soldering (the intervening circuit board being a thermal insulator).

It is therefore an object of the present invention to provide a surface mountable integrated circuit package within which a battery may be integrated and which can withstand the temperature excursion of the solder reflow process.

It is a further object of the present invention to provide such a package of the molded encapsulated type.

It is a further object of the present invention to provide such a package of the hermetically sealed type.

It is a further object of the present invention to provide a method of fabricating such a package.

Other objects and advantages of the present invention will be apparent to those of ordinary skill in the art having reference to the following specification together with the drawings.

BRIEF DESCRIPTION OF THE DRAWINGS

FIG. 1 is a cross-sectional elevation view of an integrated circuit package according to a first embodiment of the invention.

FIG. 2 is a cross-sectional plan view of the integrated circuit package of FIG. 1.

FIG. 3 is a cross-sectional elevation view of an integrated circuit package according to a first embodiment of the invention.

SUMMARY OF THE INVENTION

The present invention may be incorporated into a surface mountable integrated circuit package of either the plastic encapsulated or the ceramic type. Battery connection leads are disposed on the opposite side of the package body from its leads, and provide electrical connection to a conventional battery or cell disposed therebetween, and to the chip mounted within the package. Standoffs, formed of a material with poor thermal conductivity, may be provided to support the cell in a spaced-apart manner from the package body. As a result of the leads and standoffs, an air gap is provided between much of the cell and the circuit package; alternatively, a thermally insulative (or resisitive) material may surround the cell. An enclosure covers the cell, which may also have thermally resistive standoffs to space the cell from the enclosure. The gap between the cell and the circuit package protect the cell from the extreme temperatures to which the circuit package is exposed during solder reflow mounting.

DETAILED DESCRIPTION OF THE PREFERRED EMBODIMENTS

Referring now to FIGS. 1 and 2, integrated circuit package 10 according to a first embodiment of the invention will now be described in detail. Package 10 is of the ceramic hermetically sealed type, and as such includes header 12, fabricated of a ceramic material, onto which chip 14 is attached by way of conventional conductive epoxy or eutectic mount. Bond wires 16 connect leads (not shown) of header 12 to chip 14 in the conventional manner. Lid 17 covers the cavity of header 12 within which chip 14 is mounted; in the example of FIG. 1, lid 17 is of the metal type and is soldered onto header 12. Alternatively, lid 17 may be of the ceramic type, in which case the sealing of the package is performed by conventional glass reflow techniques. Solder bumps 18 connected to and correspond to leads of the integrated circuit packaged therewithin, and are of the type that enables package 10 to be surface mountable to a circuit board. Alternatively, package 10 may be of the leadless chip carrier type, in which case no such solder bumps 18 are provided.

The function provided by chip 14 may be of any type for which battery power or backup is useful. For example, chip 14 may be a memory circuit, such as a CMOS static RAM, for which battery backup power is useful in retention of stored data. Alternatively, chip 14 may embody a functional circuit, such as a timer or data processing circuit, for which battery backup power is useful in enabling certain operations.

According to this embodiment of the invention, cell 20 is mounted integrally within package 10 on the opposite side of header 12 from solder bumps 18. Cell 20 is of conventional type, such as the lithium or silver-zinc types. In this embodiment of the invention, lower battery lead 22 extends from header 12, and is in contact with the negative side of cell 20. Referring to FIG. 2, lower battery lead 22 is in contact with connection tab 21 at the surface of header 12, tab 21 being a gold-plated land similar to an external land of a leadless chip-carrier. Lower battery lead 22 may be attached to tab 21 by way of welding or another conventional method. Tab 21 is in electrical communication with chip 14 via a bond wire 16, allowing the negative side of cell 20 to bias chip 14.

Lower and upper battery leads 22, 24 are generally welded to cell 20 prior to its installation into package 10. As such, the attachment of leads 22, 24 to tabs 21, 23, respectively, results in the installation of cell 20 into package 10.

In order to minimize thermal conduction through battery lead 22 from header 12 to cell 20 (such thermal conduction necessary to some extent since lower battery lead 22 must be electrically conductive), it is preferable to minimize the width of lower battery lead 22 (in the plan view of FIG. 2), and also its thickness (in the cross-sectional view of FIG. 1). In addition, the material of lower battery lead 22 should be selected to provide the necessary electrical conduction with minimal thermal conduction. For example, lower battery lead 22 may be formed of stainless steel, having a thickness of on the order of 5 mils and a width of 10 mils.

Lower standoffs 26 extend from the top surface of header 12 to provide structural support to cell 20. It is preferred that at least three points of contact be provided to support cell 20 from header 12. Accordingly, two lower standoffs 26 are provided, as shown in shadow in FIG. 2, so that the combination of lower battery lead 22 and lower standoffs 26 provides stable support for cell 20 from the surface of header 12. Lower standoffs 26 are preferably formed of a material with low thermal conductivity, such as glass or other ceramic material, attached by way of a non-conductive epoxy to the surface of header 12.

Similarly, upper battery lead 24 makes electrical connection between header 12 and the positive side of cell 20. Upper battery lead 24 is similarly welded or otherwise connected to tab 23 in the installation of cell 20 into package 10. Upper battery lead 24 is of the same material and substantially the same dimensions as lower battery lead 22, to minimize the thermal conduction therethrough while still maintaining electrical connection between cell 20 and chip 14.

Housing 30 is provided in package 10 according to this embodiment of the invention, to provide mechanical and environmental protection for cell 20 and battery leads 22, 24. Housing 30 may be of a thermally insulating material, such as a plastic resin or polyester glass, and is formed to the appropriate size and shape by conventional processes such as injection molding. Housing 30 is attached to the edges of header 12 by way of conventional epoxy. Upper standoffs 28 extend from the inner surface of housing 30 and provide stable support for cell 20 from the inner surface of housing 30. Where housing 30 is formed by way of molding, upper standoffs 28 may be molded integrally as part of housing 30, of the same thermally resistive or insulating material.

As a result of the combination of lower battery lead 22 and lower standoffs 26, cell 20 is spaced apart from the surface of header 12 by a distance $d_l$, as shown in FIG. 1. Similarly, as a result of the combination of upper battery lead 24 and upper standoffs 26, cell 20 is spaced apart from housing 30 by a distance $d_u$. The distances $d_l$, $d_u$ are contemplated to be on the order of 5 to 15 mils, but of course may vary according to a tradeoff between package height, on one hand, and thermal insulation on the other. This separation results in an air gap between header 12 and cell 20, and between housing 30 and cell 20, providing a high degree of thermal insulation surrounding cell 20. This thermal insulation allows for cell 20 to remain relatively cool during solder reflow, minimizing or eliminating degradation of its characteristics.

It is further contemplated that a thermally resistive or insulative material, such as an epoxy, may be inserted into the cavity surrounding cell 20. In this case, cell 20 will be thermally insulated by the inserted material rather than by the air gap, to maintain a relatively cool temperature during solder reflow.

It is also contemplated that battery leads 22, 24 may be of sufficient strength, when attached to tabs 21, 23, to support cell 20 above header 12 without requiring lower standoffs 26 and upper standoffs 28. In this case, it may be preferable to have wider battery leads 22, 24, such as on the order of 25 mils.

As a result of the present invention, therefore, package 10 enables the integration of cell 20 into package 10 in component form, prior to its surface mounting to a circuit board, eliminating the necessity and cost of subsequently installing cell 20 thereinto. Higher quality and reliability electronic systems, manufactured at a lower cost, thus results from the present invention.

In fabrication, it is contemplated that package 10 will be formed by first mounting chip 14 to header 12 in the conventional manner, followed by the bond operation for placing bond wires 16 to connect header 12 and chip 14. This operation is then followed by sealing of lid 17 over chip 14. Lower standoffs 26 are also attached to header 12, either prior to or after the mounting of chip 14 thereto.

As noted above, battery leads 22, 24 are welded or otherwise connected to cell 20 prior to its installation into package 10. Cell 20 is then installed by attaching lower battery lead 22 and upper battery lead 24 to tabs 21 and 23, with cell 20 supported by lower standoffs 26 as necessary. If solder bumps 18 are provided, bumps 18 are then formed in the conventional manner. Housing 30 may then be epoxied to header 12, providing environmental protection to cell 20, as well as structural support thereto via standoffs 28.

Referring now to FIG. 3, a second embodiment of the invention will now be described relative to surface mountable integrated circuit package 40 of the type referred to as a J-lead plastic encapsulated chip carrier. Like elements will be referred to in FIG. 3 with the same reference numerals as used in FIGS. 1 and 2, for purposes of clarity.

In the embodiment of FIG. 3, chip 14 is mounted to die attach 46 which is part of lead frame 44. Lead frame 44 is of conventional type for plastic J-lead chip carriers, and thus generally has its die attach 46 offset from the plane of its internal leads to reduce the severity of the angle of bond wires 16. Package body 42 is, in this embodiment of the invention, provided by plastic mold compound injection molded around chip 14 after its mounting and wire-bonding to lead frame 44. Such injection molding is of the conventional type for plastic encapsulated integrated circuits. After molding, in this example, the leads of lead frame 44 are bent in the conventional J-shape, as shown in FIG. 4. In the embodiment shown in FIG. 3, lower standoffs 46 extend from package body 42, and are formed in the injection molding process used to form package body 42. As in the ceramic case described hereinabove, lower standoffs 46 are preferably located to provide at least three-point support (considering lower battery lead 22 as one point of support) for cell 20.

Cell 20 is disposed between lower and upper battery leads 22, 24 in similar manner as described hereinabove relative to FIG. 1. As in the case described hereinabove, lower and upper battery leads 22, 24 are attached, such as by welding, to cell 20 prior to its installation into package 40. The size and material for lower and upper battery leads 22, 24 is preferably the same as in the embodiment of FIGS. 1 and 2 described hereinabove, to provide the desired electrical connection with minimal thermal conduction. In fabrication, cell 20 will be attached by attaching battery leads 22, 24 to tabs or lands extending from package body 42 after its molding, in such a manner that cell 20 is supported by lower standoffs 26. Housing 30, also preferably formed by injection molding to include upper standoffs 28, is then placed over cell 20, and attached to package body 42 by conventional epoxy bonding. Upper standoffs 28, in combination with upper battery lead 24, thus provide stable structural support for cell 20 in package 40.

As in the embodiment of FIGS. 1 and 2, the construction of package 40 according to the embodiment of FIG. 3 provides an air gap between cell 20 and package body 42, and between cell 20 and housing 30. This air gap similarly provides sufficient thermal insulation that cell 20 is not exposed to the temperature of solder reflow mounting of surface mountable package 40 to a circuit board. Alternatively, as in the prior case, the gap may be filled with a low thermal conductivity material. As such, cell 20 is integrated into package 40 prior to circuit board assembly, eliminating the need for an additional manufacturing operation of insertion of a battery into the package after its mounting to the circuit board.

While the invention has been described herein relative to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

We claim:

1. A method of packaging a battery integrally with a packaged integrated circuit, comprising:
   packaging an integrated circuit chip within a package body, said package body having electrical connections of the surface-mountable type on one side, and having first and second battery connections disposed at an opposing side from said electrical connections;
   after said packaging step, connecting a battery to the first and second battery connections in such a manner that a gap is present between said package body and said battery; and
   attaching a housing to said package body in such a manner that said housing covers said battery, with a gap present between said battery and said housing.

2. The method of claim 1, wherein said package body has a standoff attached to said opposing side;
   so that, after said connecting step, said battery is in contact with said standoff.

3. The method of claim 1, wherein said housing has a standoff mounted along an inner surface thereof so as to be in contact with said battery after said attaching step.

4. The method of claim 1, further comprising:
   after said attaching step, connecting the electrical connections to a circuit board.

5. The method of claim 4, wherein said step of connecting the electrical connections to a circuit board comprises a solder reflow process.

6. The method of claim 1, wherein said packaging step comprises:
   mounting an integrated circuit chip to a lead frame; and
   encapsulating said integrated circuit chip and lead frame with a plastic encapsulant.

7. The method of claim 6, wherein said encapsulating steps forms a standoff on the opposing side of said package body from the electrical connections.

8. The method of claim 1, wherein said packaging step comprises:
   mounting an integrated circuit chip to a header; and
   attaching a lid to said header over said integrated circuit chip.

9. The method of claim 8, further comprising:
   attaching a standoff to the opposing side of said package body from the electrical connections.

10. The method of claim 1, further comprising:
    attaching the battery to first and second battery leads; and wherein said connecting step comprises:
    connecting the first and second battery leads to the first and second battery connections.

11. The method of claim 10, wherein said placing step is performed prior to said connecting step.

12. The method of claim 1, further comprising:
    inserting a thermally resistive material into the gap between the battery and the package body.

* * * * *